US008498842B2

(12) United States Patent  
Kelly et al.

(10) Patent No.: US 8,498,842 B2  
(45) Date of Patent: Jul. 30, 2013

(54) SYSTEM AND METHOD FOR CHAINING GRAPHICAL CURVES

(75) Inventors: Andrew J. Kelly, Glendale, OH (US); Avijit Sen, Pune (IN); James Joseph Wojcik, Cincinnati, OH (US); Rahul Rajendra Gulhane, Nagpur (IN); Vinit Shukla, Pune (IN); Maitray Shrivastava, Navi-Mumbai (IN); Nilesh Madhav Rajhans, Pune (IN); Sachin Shivajirao Shirke, Pune (IN); Amit Ashok Inamdar, Pune (IN)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 567 days.

(21) Appl. No.: 12/770,158

(22) Filed: Apr. 29, 2010

(65) Prior Publication Data

US 2011/0270581 A1 Nov. 3, 2011

(51) Int. Cl.  
*G06F 17/10* (2006.01)

(52) U.S. Cl.  
USPC .................................................. 703/2

(58) Field of Classification Search  
USPC .................................................. 703/2  
See application file for complete search history.

(56) References Cited

U.S. PATENT DOCUMENTS

| 2006/0001664 | A1 | 1/2006 | Carbonera | |
| 2007/0179685 | A1* | 8/2007 | Milam et al. | 701/3 |
| 2009/0326876 | A1 | 12/2009 | Miller | |

OTHER PUBLICATIONS

MSC Patran product Reference Manual; Part 2: Geometry Modeling; pp. 1-734; 2004.*  
Perez et al.; A curvature-based path tracking method for autonomous mobile robot. Proc. of the 8th Int. Symposium on Intelligent Robotics Systems (SIRS'OO), pp. 335-340, Reading—UK, 2000.*  
Shih et al. discloses: Forward and Backward Chain-Code Representation for Motion Planning of Cars; International Journal of Pattern Recognition and Artificial Intelligence; vol. 18, No. 8 (2004) 1437-1451.*  
Vucina et al.; A Compact Parameterization for Shape Optimization of Aerofoils; Proceedings of the World Congress on Engineering 2008 vol. I; WCE 2008, Jul. 2-4, 2008, London, U.K; pp. 1-6.*  
Corral et al.; Parametric Design of Turbomachinery Airfoils Using Highly Differentiable Splines; Journal of Propulsion and Power; vol. 20, No. 2, Mar.-Apr. 2004; pp. 335-343.*  
Shin et al.; Minimum-Time Control of Robotic Manipulators with Geometric Path Constraints; IEEE Trans. Automatic Control; vol. AC-30; No. 6; 1985; pp. 531-541.*  
Hwang et al. "Mobile robots at your fingertip: Bezier curve on-line trajectory generation for supervisory control"; Proceedings of the 2003 IEEE/RSJ Intl. Conference on Intelligent Robots and Systems; Las Vegas, Nevada; Oct. 2003; pp. 1444-1449.*

(Continued)

*Primary Examiner* — Hugh Jones

(57) ABSTRACT

A CAD system and corresponding method and computer program product. A method includes receiving a set of intersecting curves and receiving a selection of a source curve and a destination curve from the set of intersecting curves. The method includes receiving a selection intent rule and calculating a first chain of curves that includes the source curve, through the set of intersecting curves according to the selection intent rule. The method includes storing a selected path, the selected path being a chain of curves between the source curve and the destination curve with a minimum number of deviations from the selection intent rule.

18 Claims, 9 Drawing Sheets

OTHER PUBLICATIONS

Flores et al.: Trajectory Generation for Differentially Flat Systems via NURBS Basis functions with Obstacle Avoidance; Proceedings of the 2006 American Control Conference Minneapolis, Minnesota, USA, Jun. 14-16, 2006; pp. 5769-5775.*

Hachour: A three dimensional collision-free-path Planning; International Journal of Systems Applications, Engineering & Development Issue 4, vol. 3, 2009; pp. 117-126.*

Zhang et al.; An Enhanced Optimization Approach for Generating Smooth Robot Trajectories in the Presence of Obstacles; Proc. 1995 European-Chinese Automation Conference, London, Sep. 1995; pp. 1-6.*

Zhang et al.; Robust Subgoal Planning and Motion Execution for Robots in Fuzzy Environments; Intelligent Robots and Systems '94. 'Advanced Robotic Systems and the Real World', IROS '94. Proceedings of the IEEE/RSJ/GI International Conference on; pp. 447-453; 1994.*

Zhang et al.; Emulation of Spline Curves and Its Applications in Robot Motion Control; Fuzzy Systems, 1994. IEEE World Congress on Computational Intelligence., Proceedings of the Third IEEE Conference on; pp. 831-836; 1994.*

PCT International Search Report mailed Nov. 26, 2012 corresponding to PCT International Application No. PCT/US2011/034038 filed Apr. 27, 2011 (4 pages).

Written Opinion of the International Searching Authority dated Nov. 26, 2012 in connection with International Application No. PCT/US2011/03403.

Written Opinion of the International Searching Authority mailed Nov. 26, 2012 corresponding to PCT International Application No. PCT/US2011/034038.

* cited by examiner

SYSTEM AND METHOD FOR CHAINING GRAPHICAL CURVES

TECHNICAL FIELD

The present disclosure is directed, in general, to systems and methods for use in computer-aided design, manufacturing, engineering, modeling, and visualization (individually and collectively, "CAD" and "CAD systems") and in product lifecycle management ("PLM") and other systems.

BACKGROUND OF THE DISCLOSURE

Many manufactured products are first designed and modeled in CAD systems, and PLM systems are used by manufacturers, retailers, customer, and other users to manage the design, use, and disposal of various products. Improved systems are desirable.

SUMMARY OF THE DISCLOSURE

Various disclosed embodiments include a CAD system and corresponding method and computer program product. A method includes receiving a set of intersecting curves and receiving a selection of a source curve and a destination curve from the set of intersecting curves. The method includes receiving a selection intent rule and calculating a first chain of curves that includes the source curve, through the set of intersecting curves according to the selection intent rule. The method includes storing a selected path, the selected path being a chain of curves between the source curve and the destination curve with a minimum number of deviations from the selection intent rule. Additional intermediate curves can also be specified through which the existing path gets rerouted.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
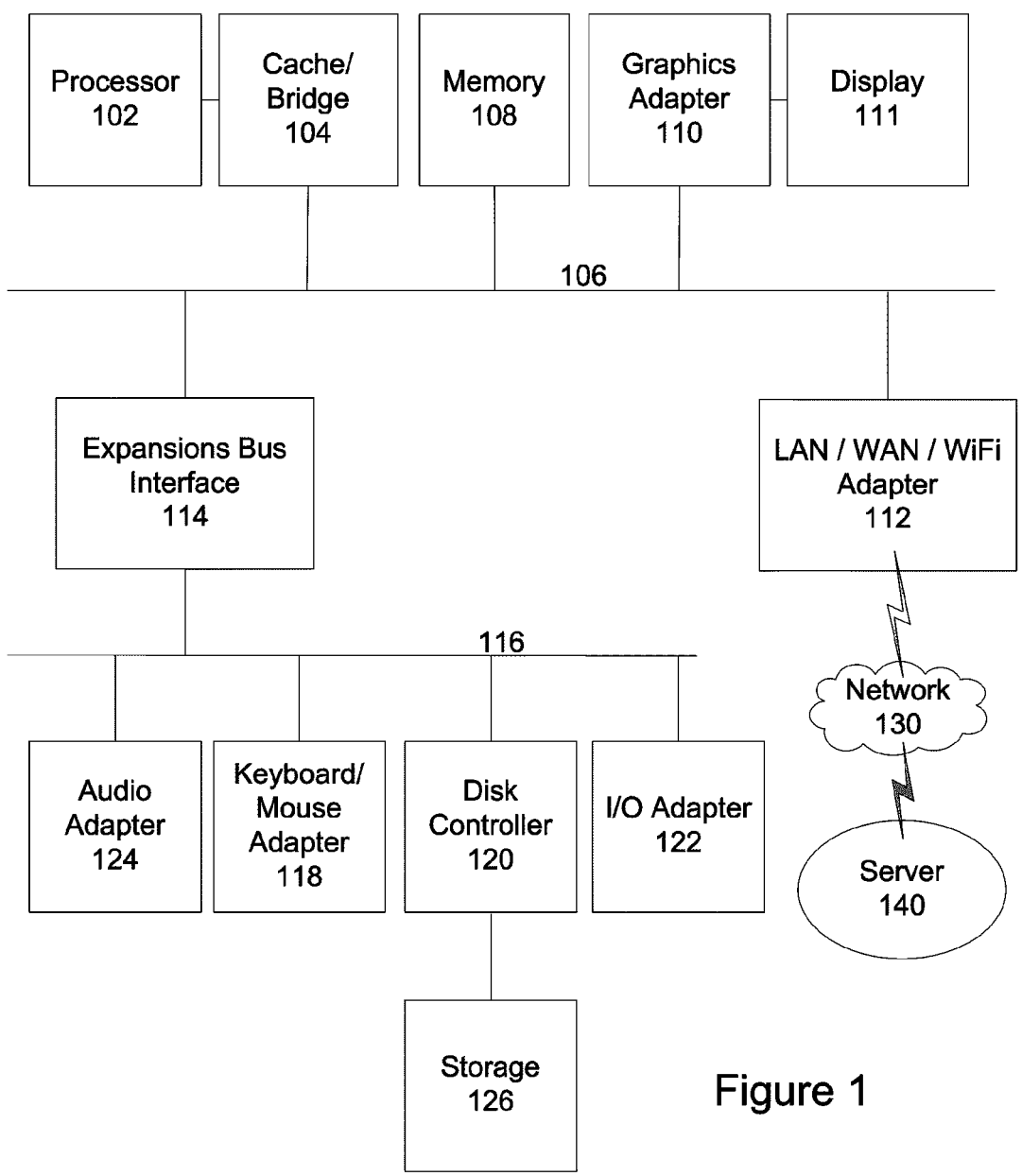
FIG. 1 depicts a block diagram of a data processing system in which an embodiment can be implemented.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

In conventional CAD system, a collection of curves or edges, or a mixture of curves and edges are used as input to various processes. As used herein, both "curves" and "edges" as known in the CAD art will be referred to as "curves" to avoid multiple terminologies. As used herein, a "chain" is a collection of connected curves, as described below, and a "path" is a collection or series of connected curves between and including a source curve and a destination curve.

Often the user is trying to collect a subset of curves and portions of curves from a very complex network of intersecting curves. Conventional systems require inefficiently selecting curve portions one-at-a-time or in small groups.

"Selection Intent" refers to an existing function and technique that can be used in disclosed embodiments. Selection intent provides various methods for collecting curves.

A selection intent rule is the criterion by which curves are automatically collected when a seed curve is explicitly selected. Examples of such rules are "Connected Curves", "Tangent Curves" and "Single Curve".

If a "Connected Curves" rule is chosen, then the explicit selection of a single curve will cause all the curves that are uniquely connected to its ends to be automatically selected, and the curves that are uniquely connected to those curves to be automatically selected, and so on. Because of this cascading selection process, the collection of curves is called a 'chain'.

This collection of curves exists, and is remembered, as a connected chain of curves. If at a later time, curves are added to the underlying curves, and those curves meet the selection intent rule, then they will be automatically added to the collection.

If a curve or line is selected using a "Tangent Curves" selection intent rule, then the curves that are tangentially connected automatically get selected. If a curve or line is selected using a "Single Curve" selection intent rule, then only the curve explicitly selected by the user is in the collection; no other curves are automatically included.

The embodiments disclosed herein can be implemented using "Connected Curves", "Tangent Curves", and "Single Curve" selection intent rules.

Several options are available which provide additional control when collecting curves. Selection intent rules determine the kind of curves that will get automatically added to the collection when a specific curve is selected. A "Stop at Intersection" option is relevant for only the "Connected Curves", "Tangent Curves" and "Single Curve" rules. This option is specified when the user wants the automatic or manual selection of curves to be limited by intersecting curves. When specified, the 'Stop at Intersections' option enables the selection of portions of curves (between intersection), rather than the entire curve.

If a line is selected using the "Tangent Curves" Selection Intent rule along with the "Stop at Intersection" option, then the resulting collection is limited by the intersecting curves. The collection does not contain the complete tangent chain, but only the portion of the chain which is between the intersections of the chain.

For a dense network of curves it often becomes very tedious to define the desired collection of curves by using a combination of a desired Selection Intent rule and options. Defining the desired collection typically requires a large number of on-screen selections, often with frequent zoom-out and zoom-in operations which makes the chances of wrong selections very high. All of these have a direct impact on the productivity of the user.

For example, a dense network of intersecting curves might require twelve on-screen selections to define the collection using the "Single Curve" rule and the "Stop at Intersection" option. The disclosed embodiments provide systems and methods that enable the system or user to define the desired collection with significantly fewer on-screen selections. Disclosed embodiments provide systems and methods by which the user and system can easily modify an existing collection to a more desirable collection. Disclosed embodiments significantly improve the productivity of defining a collection of curves from a complex network of curves.

FIG. 1 depicts a block diagram of a data processing system in which an embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments significantly improve the productivity of defining a collection of curves from a complex network of curves. As described above, many CAD systems and functions require a collection of curves as an input.

Figure 2:
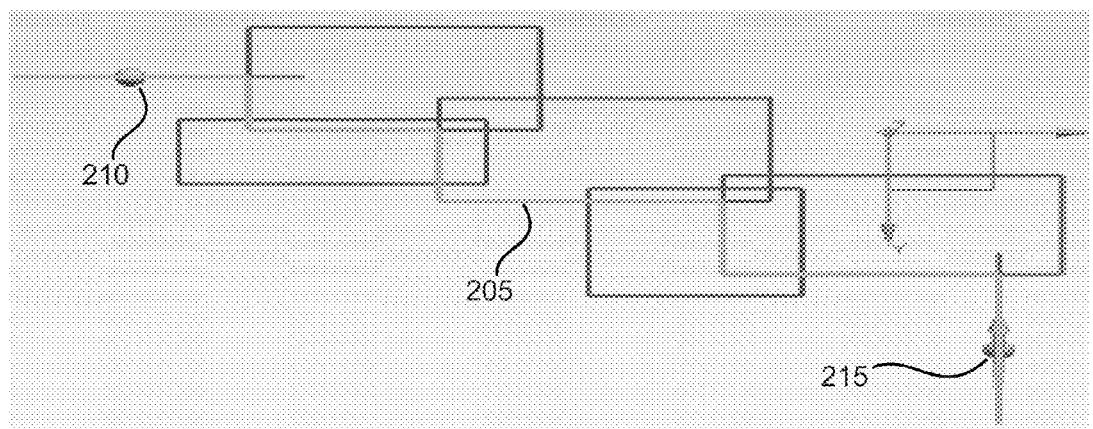
FIG. 2 depicts an exemplary collection of curves with a selection using techniques as described herein.

FIG. 2 depicts an exemplary collection of curves with a selection using techniques as described herein. Selection of the emphasized collection of curves, path 205, requires only two on-screen selections using the techniques disclosed herein. The two required on-screen selections are indicated at 210 and 215.

Using conventional techniques, twelve manual user selections would be required to identify the same collection of curves by using a combination of a desired Selection Intent rule and options. By reducing the number of required selections, in this example, from twelve to two, the efficiency of the CAD design process is significantly improved.

Disclosed embodiments include a new interaction model for defining a collection of curves, and a systems and methods for finding the desired collection with a minimum amount of user input.

The basic interaction, according to disclosed embodiments, is for the system to receive a user selection of a sequence of input curves that the collection must contain. The system then determines the curves that connect these input curves, and adds them to the collection. As used herein, the collection of curves will be referred to as a "Path". The detailed criteria for finding the path and the main criterion are described herein.

In various embodiments, the interaction model also provides real-time visual feedback of the path when the cursor lies on a potential input curve. With this feedback, the user can see the exact path that will result if the curve under the cursor is selected. As the system receives the user's input of moving the cursor over a portion of the curve, the system can automatically perform processes as described herein to select and display the entire path in real time.

For example, in FIG. 2, assume that the curve 210 was selected as input, and then the cursor is placed on the curve 215. The process described herein finds the path between these two curves in accordance with a pre-defined criterion. This is done in real-time, and the "Path" is displayed in a distinctive color. If curve 215 is selected then the path 205 is created.

Various embodiments consider at least two criterion for the calculation of a Path. A primary criterion is that the best "Path" must minimize the number of times it deviates from the specified Selection Intent (SI) "Rule". As an illustration, one may consider the example of a person travelling along a source road with the aim of reaching a destination road. The ideal route would be one that always obeys the SI rule throughout. Any other route is considered a deviation from the ideal route. According to various embodiments, the primary criterion differs from common approaches in that this criterion it is not based on shortest path length, which is very common for many path finding algorithms. It is based on minimizing the number of times the system might violate the routing rule.

The following example illustrates this criterion. The user wants to create a path by specifying the "Tangent Curves" rule and selecting two curves. The path calculated by the system will be the one that has the minimum number of deviations from the Tangent Curves rule, rather than any shorter path with a greater number of rule deviations.

A secondary criterion is that if multiple "Paths" with the same number of deviations are found, then the path which has the shortest length will be chosen. For example, if a user selects two curves and the "Connected Curves" rule, there may be multiple paths with the same number of deviations. In such a case, the system will select the shortest of these paths. Note that, as described herein, any reference to a user input or user selection is understood to include the system receiving such input or selection via an appropriate input device.

The interaction also allows the removal of any explicitly selected input curve, replacement of an explicitly selected input curve with another curve, and the rerouting of a path through a new input curve that will be selected between two previously selected input curves. The affected path gets modified accordingly.

The disclosed processes provide significant advantages over current approaches. For example, various embodiments allow a very fast convergence rate towards the best path. The robust design of the convergence criterion ensures that further computation will always give paths with higher number of deviations.

Further, if there are multiple paths with the same number of deviations from ideal, then all of them are found at the same depth of the iteration. The performance of the processes herein does not depend on the global complexity of the model. It depends on the local complexity in the neighborhood of the source and destination curves.

The disclosed processes also ensure that any curve which is already part of the collection does not contribute to the path finding process.

The algorithm is a bi-directional search algorithm which starts simultaneously from the source and the destination curves. The key to the fast convergence is the concept of the depth of iteration. At any depth of iteration the minimum number of deviations that can happen is known.

Figure 3:
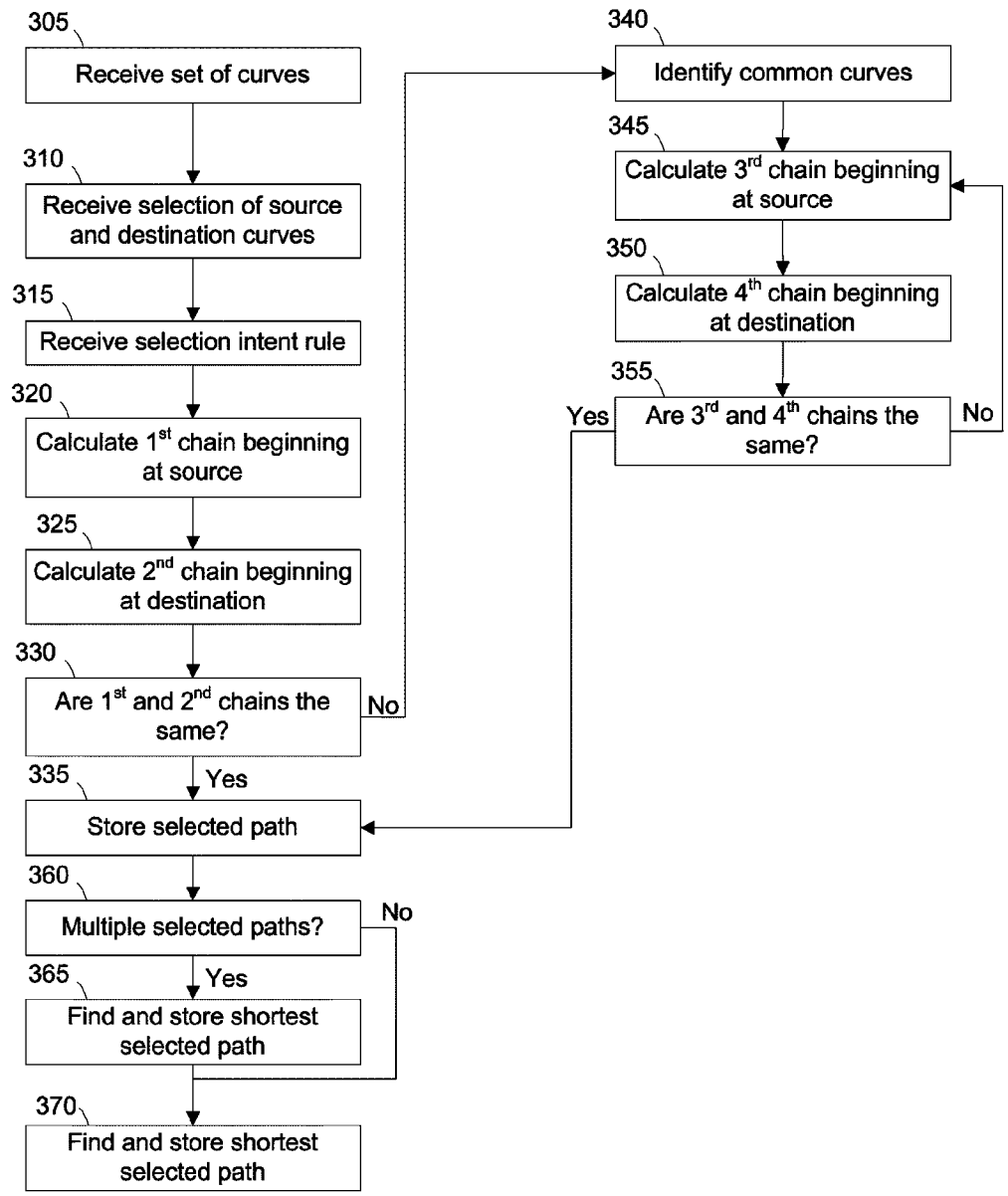
FIG. 3 depicts a flowchart of a high-level process in accordance with disclosed embodiments.

FIG. 3 depicts a flowchart of a high-level process in accordance with disclosed embodiments. Note that various steps may be performed concurrently; in particular and without limitation, path calculation from source and destination curves as described below is preferably performed concurrently.

The system receives a set of curves from which a path is to be found (step 305). As used herein, "receiving" can include loading from storage, receiving from another system such as over a network or otherwise, being input by a user, and otherwise as known to those of skill in the art. The set of curves can be part of any 2D or 3D model or other structure in a CAD system.

The system receives a selection of a source curve and a destination curve from the set of curves (step 310).

The system optionally receives a selection of a selection intent rule, and can receive other options (step 315).

The system calculates a first chain—a collection of curves—beginning at (or at least including) the source curve according to any selected selection intent rule (step 320). This chain may form part or the entirety of a path from the source curve to the destination curve.

The system calculates a second—a collection of curves—beginning at (or at least including) the destination curve according to any selected selection intent rule (step 325). This chain may form part or the entirety of a path from the destination curve to the source curve.

The system compares the first chair and the second chain to determine if they are the same (step 330). If they are the same, then the system marks this chain as the selected path between the source and destination curves (step 335), stores it, and it will have zero deviations.

If they are not the same (at step 330), then the system identifies the common curves that intersect with the first chain and the second chain (step 340), as these are the only ways by which the path can deviate. An intersection indicates that these curves can be common to both the first chain and the second chain to form a complete path.

The system calculates a third chain beginning at the source curve according to the first and second criterion, and according to any selected selection intent rule, that includes at least one of the common curves (step 345).

The system calculates a fourth chain beginning at the destination curve according to the first and second criterion, and according to any selected selection intent rule, that includes the at least one of the common curves (step 350).

The system compares the third chain and the fourth chain to determine if they are the same (step 355), or compares other paths in subsequent iterations. If any of them match then the system marks this chain as the selected path or chain (at step 335), and it has 1 deviation.

If the paths do not match (at step 355), then the process repeats to step 345 using another common curve, until a selected path is identified and marked (at step 335).

If multiple selected paths with the same number of minimum deviations are found (step 360), then the system finds and stores the shortest of these paths (step 365), using techniques referenced herein. If there are not multiple selected paths, or after the shortest of the selected paths is found and stored, the process ends (step 370).

The process described above finds a chain and stores the data related in a compact format for given input curve. If the first chain and the second chain are not the same, then calculating at least one additional chain to find a path between the source curve and the destination curve having one or more deviations from the selection intent rule. In cases where multiple selected paths are stored, a shortest one of the multiple selected paths is identified. In some cases, the stored selected path is the shortest path between the source curve and the destination curve of multiple paths having the same minimum number of deviations from the selection intent rule.

Dijkstra's Algorithm is well known to those of skill in the art as a technique for finding a shortest path. The other techniques described herein differ significantly from the known approach and provide significant advantages.

One disclosed approach includes a process to find minimum number of chains between two chains in which there is no single active node but, instead, multiple active nodes which are processed simultaneously called a 'level'. The simultaneous processing is possible in this case since the cost of moving from one chain to other chain is always unity.

According to the process for this approach, let the start chain be C1. In this approach, the system processes all the intersections of this chain with rest of the curves in the received set of curves. These intersections then are used for creating next level's chains. In this approach, the process terminates when the 2nd chain is reached at a particular level. The level indicates the number of minimum chains required to connect the two input chains.

Figure 4:
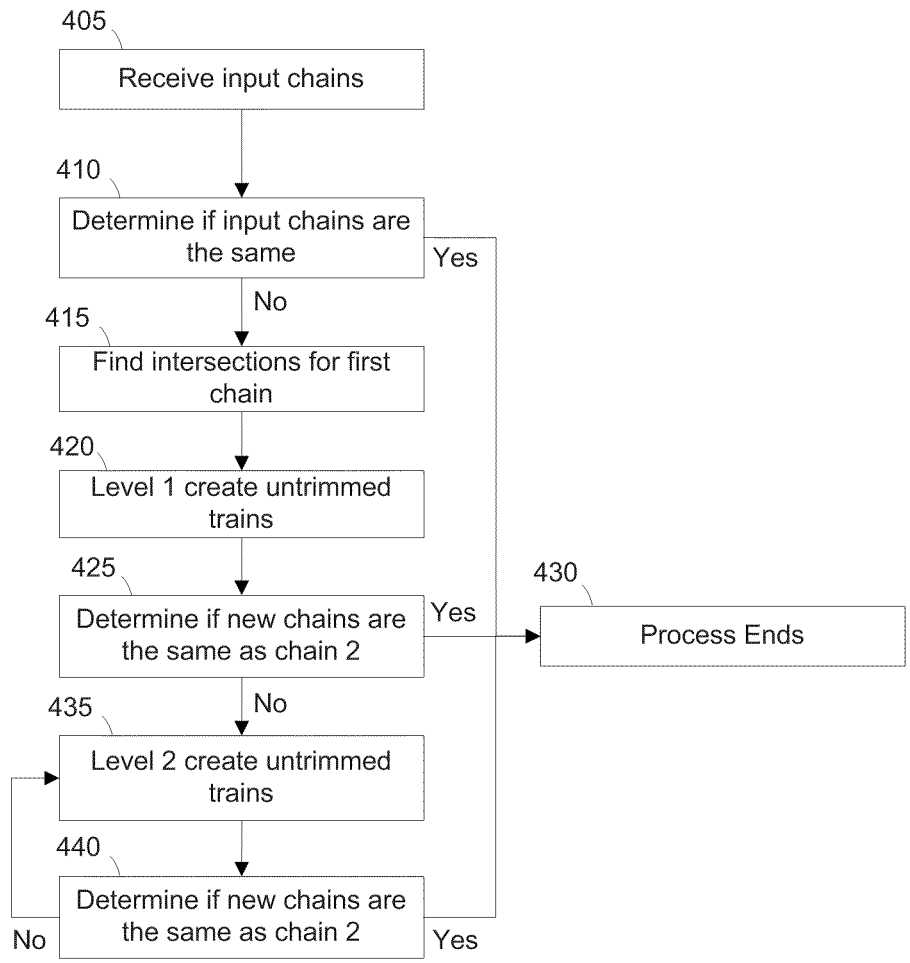
FIG. 4 depicts a flowchart of a process in accordance with disclosed embodiments.

FIG. 4 depicts a flowchart of a process for one disclosed process in accordance with disclosed embodiments. Various steps may be performed concurrently or in a different order.

The system receives the two input chains (step 405). These can correspond, for example, to a third path and a fourth path as described in the process of FIG. 3.

The system determines if the two input chains are same (step 410). If so, this indicates that the system has found the desired chain, and the process stops (step 430).

The system finds all the intersections for the first of these chains (step 415).

In a first process level, the system creates new untrimmed chains from all the intersections of chain 1 (step 420). As part of this step, the system can also find intersections for all the newly created chains. An "untrimmed" chain, as used herein, is a chain of curves that does not stop at an intersection.

In the first processing level, the system checks if any of the newly created chains is same as that of desired chain 2 (step 425). If so, this indicates that the system has found the desired chain, and the process stops (step 430).

If not, the system performs a second processing level, and creates new chains from all the intersections of all the chains found during first processing level (step 435). As part of this step, the system can also find intersections for all the newly created chains.

In the second processing level, the system checks if any of the newly created chains is same as that of desired chain 2 (step 440). If so, this indicates that the system has found the desired chain, and the process stops (step 430).

If not, the system repeats the process at step 435 for further processing levels (repeating to step 435). The processes repeats until the system reaches the desired chain 2 (and ends at step 430) or till there is no further intersection of any of the chains at a particular level to create new chains for the next level (at which point the process exits, not shown).

Figure 5:
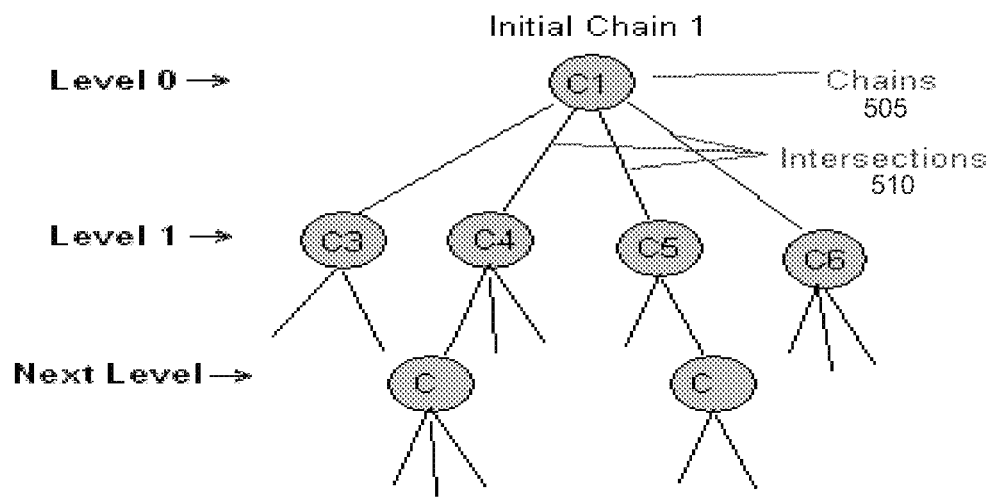
FIG. 5 shows an output tree diagram depicting the process of FIG. 4 in accordance with disclosed embodiments.

FIG. 5 shows an output tree diagram depicting the process of FIG. 4 in accordance with disclosed embodiments. Shown here are chains 505 shown as nodes or leaves, and the intersections 510 between each of the chains. Three levels of processing are shown here; the first level 0, the second level 1, and a subsequent level 2.

Figure 6:
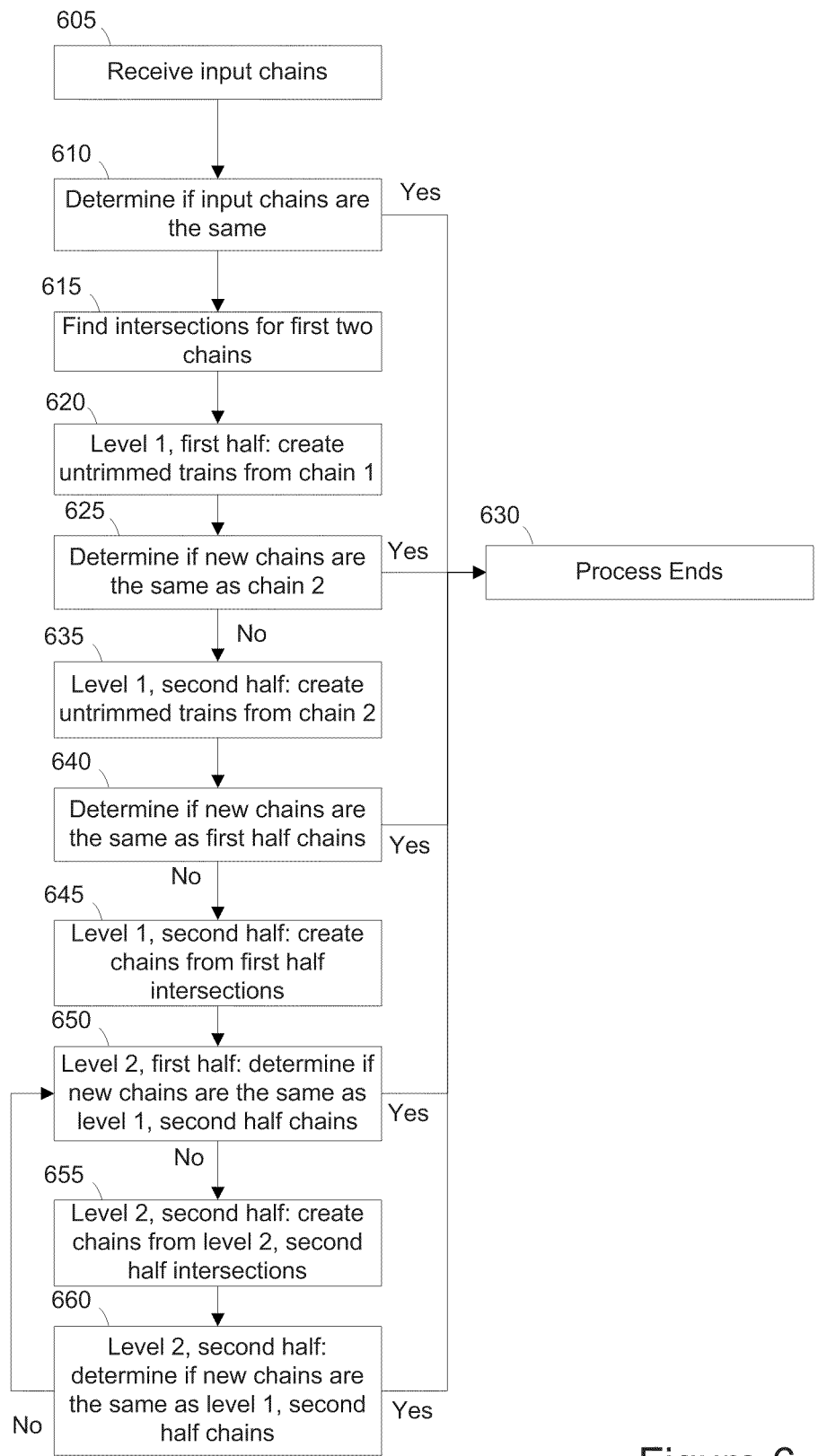
FIG. 6 depicts a flowchart of a process in accordance with disclosed embodiments.

FIG. 6 depicts a flowchart of a process for a currently-preferred process in accordance with disclosed embodiments. In this process, each level of processing is divided into a "first half" working from the source curve and a "second half" working from the destination curve. Various steps may be performed concurrently or in a different order.

The system receives the two input chains (step 605). These can correspond, for example, to a third chain and a fourth chain as described in the process of FIG. 3. These input chains are, in preferred embodiments, chains that are seeded from the source curve and the destination curve, respectively.

The system determines if the two input chains are same (step 610). If so, this indicates that the system has found the desired chain, and the process stops (step 630). This is a case of zero deviations.

The system finds all the intersections for the first two of these chains (step 615), referred to as chain 1 and chain 2. These can be, for example, a chain containing the source curve and a chain containing the destination curve.

For the first half of a first processing level, the system creates new untrimmed chains from all the intersections of chain 1 (step 620). As part of this step, the system can also find intersections for all the newly created chains.

For the first half of the first processing level, the system checks if any of the newly created chains is same as that of desired chain 2 (step 625). If so, this indicates that the system has found the desired chain, and the process stops (step 630).

For the second half of the first processing level, the system creates new untrimmed chains (chains with stop at intersection 'off') from all the intersections of chain 2 (step 635). As part of this step, the system can also find intersections for all the newly created chains.

For the second half of the first processing level, the system checks if any of the newly created chains matches any of the chains created in 'first half' of level 1 processing (step 640). If so, this indicates that the system has found the desired chain, and the process stops (step 630).

For the first half of the first processing level, the system creates new chains from all the intersections of all the chains found during processing of 'first half' of Level 1 (step 645). As part of this step, the system can also find intersections for all the newly created chains.

For the first half of a second processing level, the system checks if any of the newly created chains matches any of the chains created in 'second half' of level 1 (step 650). If so, this indicates that the system has found the desired chain, and the process stops (step 630).

For the second half of a second processing level, the system creates new chains from all the intersections of all the chains found during processing of 'second half' of Level 1 (step 655). As part of this step, the system can also find intersections for all the newly created chains.

For the second half of a second processing level, the system checks if any of the newly created chains matches any of the chain created in 'first half' of level 2 (step 660). If so, this indicates that the system has found the desired chain, and the process stops (step 630).

The system then repeats the process until a match is found (repeating to step 650) or until there is no further intersection available for any of the chains in any of the either half at a particular level to create new chains for the next level (at which point the process exits, not shown).

Figure 7:
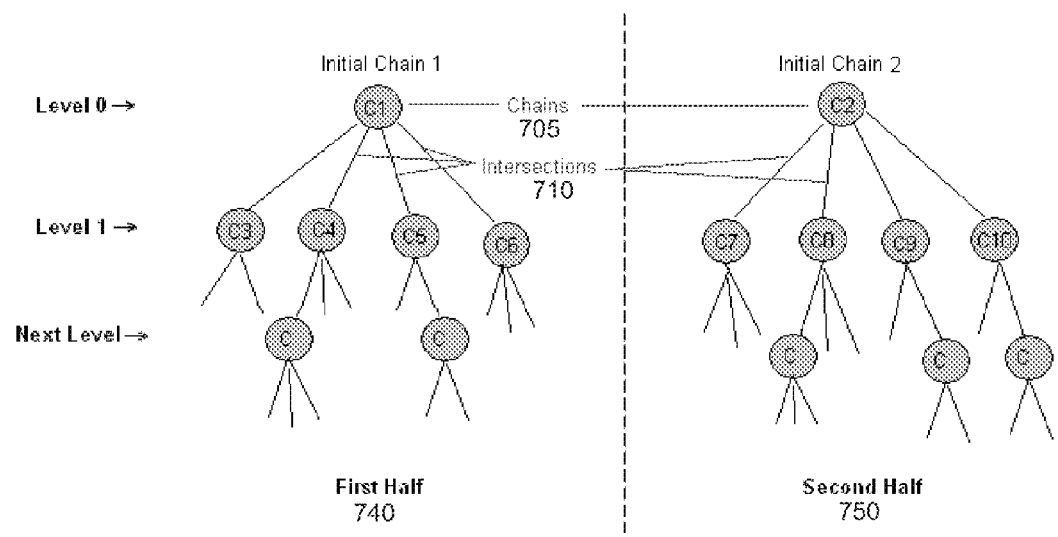
FIG. 7 shows an output tree diagram depicting the process of FIG. 6 in accordance with disclosed embodiments.

FIG. 7 shows an output tree diagram depicting the process of FIG. 6 in accordance with disclosed embodiments, divided into first half 740 and second half 750, each forming its own tree. Shown here are chains 705 shown as nodes or leaves, and the intersections 710 between each of the chains. Three levels of processing are shown here; the first level 0, the second level 1, and a subsequent level 2.

As described above, the result of the processes of some embodiments is a tree-like structure from which all the possible solutions can be extracted by traversing the tree.

The input to a process for finding the shortest path from the tree structure is the nodes that matched at the end of the process. Each node contains information about the chain and its intersections with rest of the elements of the model along with preceding nodes and the intersection information from preceding nodes from which current chain was formed.

From the terminating node, the preceding node along with the intersection information from which the terminating node was formed is retrieved and stored. This intersection information is one of the limits of the terminating chain.

From the preceding node, again the process of finding preceding chain and its intersection information is repeated until the first chain in the tree is reached.

At any point of time in the tree list, at a particular node there can be multiple preceding nodes along with their intersection information. Multiple preceding nodes imply that there are multiple chains from which the current chain can be formed. This condition needs to be resolved based on minimum path length.

Figure 8:
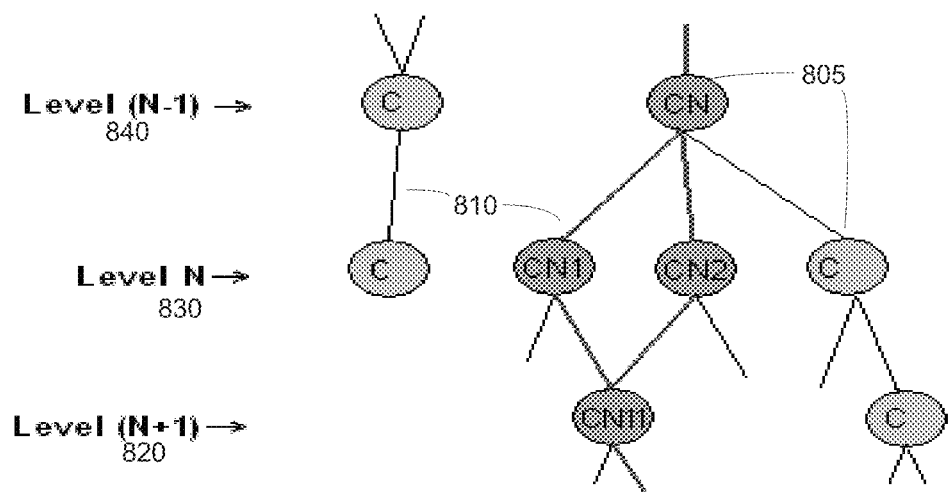
FIG. 8 depicts an illustrative, non-limiting example of a tree structure in accordance with disclosed embodiments.

FIG. 8 depicts an illustrative, non-limiting example of a tree structure in accordance with disclosed embodiments, showing chains 805 as nodes or leaves and intersections 810 between each of the chains. While traversing back from level N+1 820, the node (CN11) at level N+1 has two preceding nodes (CN1 and CN2) from level N 830. This implies that chain at level N+1 can be formed from two chains at level N. This means multiple paths exists up to level N+1 and needs resolving.

For resolving, the nodes at level N are again backtracked to a common chain. In the above example, the common node happens to be the highlighted node at Level N−1 840 (node CN). Since Node at N−1 is part of the minimum chains solution and has only one intersection (meaning it was formed from intersection of only one chain from its previous level), the minimum path length needs to be calculated from Level N−1 840.

For path length calculation, the length of the chain is calculated as follows—

For level N, node CN1, the length of the chain will be the trimmed chain length between Node CN1's intersection with Node CN and intersection of node CN1 with CN11.

Thus, Chain Length {CN1}={Length of CN1 Chain between its intersections with previous node and next node i.e. Nodes CN and CN11 respectively}

Minimum Path length=Minimum of

{Chain Length [CN]+Chain Length [CN1]+Chain Length [CN11]} &

{Chain Length [CN]+Chain Length [CN2]+Chain Length [CN11]}

The result of multiplicity resolver is the tree structure modified to form a linked list structure.

Figure 9:
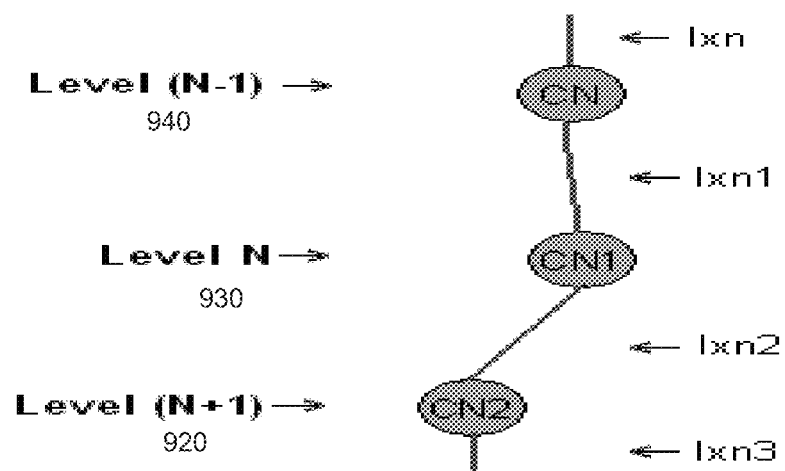
FIG. 9 depicts a nonlimiting example of a linked list tree structure in accordance with disclosed embodiments.

FIG. 9 depicts a nonlimiting example of a linked list tree structure in accordance with disclosed embodiments. Each node in the linked list will point to next node in the list and will also have information of previous node along with intersection information.

The chain recipe can be extracted from this linked list as follows. While traversing up from node CN2 at level (N+1) 920, the intersection information of CN1 is available and stored as one of the limits of chain in Node CN1 at level (N) 930. At node CN1, intersection information of preceding node is available. This intersection information will serve as the other limit for chain in node CN1. This intersection information will also serve as one of the limits for the chain preceding chain CN1. In this way, all the nodes are traversed up to the input chain to node CN at level (N11) 940.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for automatic path determination in a CAD system, comprising:
   receiving a set of intersecting curves in a hardware CAD system;
   receiving by the CAD system a selection of a source curve and a destination curve from the set of intersecting curves;
   receiving a selection intent rule by the CAD system;
   calculating a first chain of curves that includes the source curve, by the CAD system, through the set of intersecting curves according to the selection intent rule; and
   storing a selected path in the CAD system, the selected path being a chain of curves between the source curve and the destination curve with a minimum number of deviations from the selection intent rule;
   wherein the stored selected path is the shortest path between the source curve and the destination curve of multiple paths having the same minimum number of deviations from the selection intent rule.

2. The method of claim 1, further comprising calculating a second chain of curves that includes the destination curve, through the set of intersecting curves according to the selection intent rule.

3. The method of claim 2, further comprising determining if the first chain of curves and the second chain of curves are the same.

4. The method of claim 2, wherein, if the first chain of curves and the second chain of curves are not the same, then calculating at least one additional chain of curves including the source curve having one or more deviations from the selection intent rule.

5. The method of claim 2, wherein, if the first chain of curves and the second chain of curves are not the same, then calculating at least one additional chain of curves including the source curve and at least one additional curve that is common to both the first chain of curves and the second chain of curves.

6. The method of claim 1, wherein multiple selected paths are stored, and a shortest one of the multiple selected paths is identified.

7. A CAD system comprising a processor and accessible memory, the CAD system particularly configured to perform the steps of:
   receiving a set of intersecting curves;
   receiving a selection of a source curve and a destination curve from the set of intersecting curves;
   receiving a selection intent rule;
   calculating a first chain of curves that includes the source curve, through the set of intersecting curves according to the selection intent rule; and
   storing a selected path, the selected path being a chain of curves between the source curve and the destination curve with a minimum number of deviations from the selection intent rule;
   wherein the stored selected path is the shortest path between the source curve and the destination curve of multiple paths having the same minimum number of deviations from the selection intent rule.

8. The CAD system of claim 7, further configured to perform the step of calculating a second chain of curves that includes the destination curve, through the set of intersecting curves according to the selection intent rule.

9. The CAD system of claim 8, further configured to perform the step of determining if the first chain of curves and the second chain of curves are the same.

10. The CAD system of claim 8, further configured to perform the step of calculating at least one additional chain of curves including the source curve having one or more deviations from the selection intent rule if the first chain of curves and the second chain of curves are not the same.

11. The CAD system of claim 8, further configured to perform the step of calculating at least one additional chain of curves including the source curve and at least one additional curve that is common to both the first chain of curves and the second chain of curves, if the first chain of curves and the second chain of curves are not the same.

12. The CAD system of claim 7, wherein multiple selected paths are stored, and a shortest one of the multiple selected paths is identified.

13. A non-transitory computer-readable storage medium encoded with computer-executable instructions that, when executed, cause a CAD data processing system to perform the steps of:
   receiving a set of intersecting curves;
   receiving a selection of a source curve and a destination curve from the set of intersecting curves;
   receiving a selection intent rule;
   calculating a first chain of curves that includes the source curve, through the set of intersecting curves according to the selection intent rule; and
   storing a selected path, the selected path being a chain of curves between the source curve and the destination curve with a minimum number of deviations from the selection intent rule;
   wherein the stored selected path is the shortest path between the source curve and the destination curve of multiple paths having the same minimum number of deviations from the selection intent rule.

14. The computer-readable storage medium of claim 13, further encoded with computer-executable instructions that, when executed, cause a CAD data processing system to perform the step of calculating a second chain of curves that includes the destination curve, through the set of intersecting curves according to the selection intent rule.

15. The computer-readable storage medium of claim 14, further encoded with computer-executable instructions that, when executed, cause a CAD data processing system to perform the step of determining if the first chain of curves and the second chain of curves are the same.

16. The computer-readable storage medium of claim 14, further encoded with computer-executable instructions that, when executed, cause a CAD data processing system to perform the step of calculating at least one additional chain of curves including the source curve having one or more deviations from the selection intent rule if the first chain of curves and the second chain of curves are not the same.

17. The computer-readable storage medium of claim 14, further encoded with computer-executable instructions that, when executed, cause a CAD data processing system to perform the step of calculating at least one additional chain of curves including the source curve and at least one additional curve that is common to both the first chain of curves and the second chain of curves, if the first chain of curves and the second chain of curves are not the same.

18. The computer-readable storage medium of claim 13, wherein multiple selected paths are stored, and a shortest one of the multiple selected paths is identified.

* * * * *